(12) United States Patent
Yamamoto et al.

(10) Patent No.: US 7,987,888 B2
(45) Date of Patent: Aug. 2, 2011

(54) RELEASING METHOD AND RELEASING APPARATUS OF WORK HAVING ADHESIVE TAPE

(75) Inventors: Masayuki Yamamoto, Osaka (JP); Yasuji Kaneshima, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 215 days.

(21) Appl. No.: 12/134,807

(22) Filed: Jun. 6, 2008

(65) Prior Publication Data

US 2008/0230183 A1 Sep. 25, 2008

Related U.S. Application Data

(60) Continuation of application No. 11/545,493, filed on Oct. 11, 2006, now Pat. No. 7,406,759, which is a division of application No. 10/925,964, filed on Aug. 26, 2004, now abandoned.

(30) Foreign Application Priority Data

Sep. 30, 2003 (JP) ................................. 2003-340757

(51) Int. Cl.
  *B32B 38/10* (2006.01)
  *B25B 11/00* (2006.01)
(52) U.S. Cl. .......... 156/755; 156/758; 156/941; 269/21; 279/3
(58) Field of Classification Search .................. 156/344, 156/584; 269/21; 279/3; 248/309.3
See application file for complete search history.

(56) References Cited

U.S. PATENT DOCUMENTS

| 4,721,462 | A | 1/1988 | Collins, Jr. |
| 5,171,398 | A | 12/1992 | Miyamoto |
| 5,423,716 | A | 6/1995 | Strasbaugh |
| 5,695,600 | A | 12/1997 | Goin |
| 5,707,051 | A | 1/1998 | Tsuji |
| 6,032,997 | A | 3/2000 | Elliott et al. |
| 6,238,515 | B1 | 5/2001 | Tsujimoto et al. |
| 6,272,989 | B1 * | 8/2001 | Misono et al. ................ 101/474 |
| 6,464,790 | B1 | 10/2002 | Sherstinsky et al. |
| 6,505,395 | B1 | 1/2003 | Farnworth et al. |
| 6,585,471 | B2 | 7/2003 | Odajima et al. |
| 2003/0077879 | A1 | 4/2003 | Ohno et al. |
| 2003/0102682 | A1 | 6/2003 | Kurokawa |
| 2003/0121614 | A1 | 7/2003 | Tabor et al. |

FOREIGN PATENT DOCUMENTS

| JP | 06-302569 A1 | 10/1994 |
| JP | 2003-209082 A1 | 7/2003 |
| KR | 2003-0045653 A | 6/2003 |

OTHER PUBLICATIONS

A Notice of Preliminary Rejection for the Application No. 10-2004-0073289 from Korean Intellectual Property Office dated Feb. 8, 2011.

* cited by examiner

*Primary Examiner* — Mark A Osele
(74) *Attorney, Agent, or Firm* — Cheng Law Group, PLLC

(57) ABSTRACT

In a method for releasing a work having an adhesive tape from a holding member which sucks and holds the work having the adhesive tape, the work having the adhesive tape is released from the holding member while supplying a gas which reduces a holding force of the holding member between the holding member and the work having the adhesive tape.

6 Claims, 2 Drawing Sheets

RELEASING METHOD AND RELEASING APPARATUS OF WORK HAVING ADHESIVE TAPE

This application is a continuation application of application Ser. No. 11/545,493, filed on Oct. 11, 2006 now U.S. Pat. No. 7,406,759, which is a divisional application of application Ser. No. 10/925,964, filed on Aug. 26, 2004 now abandoned which is based on Priority Document JP 2003-340757 filed on Sep. 30, 2003, the entire contents of which are hereby incorporated by reference.

BACKGROUND OF THE INVENTION (1) Field of the Invention

The present invention relates to a releasing method and a releasing apparatus of a work having an adhesive tape for releasing the work having the adhesive tape from a holding member which sucks and holds the work having the adhesive tape after it is subjected to a predetermined processing.

(2) Description of the Related Art

Conventionally, a surface protecting tape is joined to a surface of a semiconductor wafer formed with a pattern. The surface protecting tape protruding from an outer periphery of the semiconductor wafer is cut out along an outer peripheral edge of the semiconductor wafer, a back surface of the semiconductor wafer is polished in a state in which the entire semiconductor wafer surface is protected by the surface protecting tape, and the semiconductor wafer is thinned (see JP-A 6-302569, for example).

A protecting tape (dicing adhesive tape) is joined (wafer mount) to the semiconductor wafer whose back surface has been polished for cutting the wafer into chips (dicing). Then, in order to separate the surface protecting tape from the semiconductor wafer, the wafer is subjected to a so-called mount separating processing (see JP-A 2003-209082, for example). Since the semiconductor wafer is thin, it is general that the mount separating processing is carried out in a state in which a wide range of a back surface of the dicing adhesive tape is sucked and held on the holding member made of a porous material.

If the back surface of the dicing adhesive tape is sucked and held on the holding member made of a porous material, a delay of release is generated in a holding region is generated at the time of releasing, and there is a problem that the dicing adhesive tape is deformed and the semiconductor wafer is cracked or damaged.

In the mount separating processing, in order to facilitate the separation of the surface protecting tape, a heated holding member is used. Therefore, the dicing adhesive tape is deformed more and thus, the dicing adhesive tape is prone to enter into a sucking hole of the holding member, and the semiconductor wafer becomes prone to be damaged.

SUMMARY OF THE INVENTION

The present invention is made in view of the above circumstances, and it is therefore an object of the present invention to provide a releasing method and a releasing apparatus of a work having an adhesive tape for preventing a work such as a semiconductor wafer from being damaged when a back surface polishing process is completed, after a dicing adhesive tape surface joined to cut the wafer into chips (dicing) is mounted and held on the holding member which sucks and holds the dicing adhesive tape surface, the semiconductor wafer, i.e., a work having an adhesive tape to which the dicing adhesive tape is joined after a so-called mount separating processing to separate the surface protecting tape of the semiconductor wafer surface is carried out is released from the holding member which sucks and holds the adhesive tape.

In order to achieve the above object, the present invention has the following configuration:

A method for releasing a work having an adhesive tape from a holding member which sucks and holds the work having the adhesive tape, the method comprising the step of:

releasing the work having the adhesive tape from the holding member while supplying a gas which reduces a holding force of the holding member between the holding member and the work having the adhesive tape.

According to the releasing method of the present invention, by supplying the gas such that the holding force of the holding member is reduced, it is possible to reliably take out the adhesive tape entering into the sucking hole of the holding member, and to eliminate the residual pressure between the adhesive tape and the holding member. Further, since it becomes easy to release the work, it is possible to suppress the crack or damage of the work having the adhesive tape which is an article such as a semiconductor wafer or lead frame.

In the releasing method of the present invention, preferably, the gas is supplied to the entire region where the work having the adhesive tape is held between the work having the adhesive tape and the holding member.

According to the releasing method of the present invention, by supplying the gas to the entire region where the work having the adhesive tape is held, it is possible to reliably release the work having the adhesive tape.

In the releasing method of the present invention, preferably, the gas is supplied in sequence from a central portion to an outer side of the holding member.

According to the releasing method of the present invention, by supplying the gas in sequence from the central portion to the outer side of the holding member, it is possible to smoothly release the work having the adhesive tape, and to reliably prevent the work from being damaged.

In the releasing method of the present invention, preferably, the gas is supplied to the work having the adhesive tape in a vacuum sucked state.

According to the releasing method of the present invention, since the gas is supplied to the work having the adhesive tape in a vacuum sucked state, it is possible to adjust the holding force by the vacuum suction. With this, it becomes possible to adjust the holding force by the vacuum suction depending upon the kinds of the adhesive tape, and it is possible to prevent the adhesive tape from being deformed when it is vacuum sucked.

In the releasing method of the present invention, preferably, the gas is supplied from two or more gas supply openings.

According to the releasing method of the present invention, since the gas is supplied from the two or more gas supply openings, it is possible to form a gas flow in addition to gas which adjusts the holding force of the vacuum suction. Therefore, when the work having the adhesive tape is to be released, it is possible to release the work having the adhesive tape while moderating a stress applied to the work.

An example of the work having the adhesive tape is an adhesive tape whose back surface is joined to the ring frame and the semiconductor wafer to integrally form the ring frame and the semiconductor wafer.

In order to achieve the above object, the present invention also has the following configuration:

An apparatus for releasing a work having an adhesive tape from a holding member which sucks and holds the work having the adhesive tape, the apparatus comprising:

a holding table having a holding member for mounting and holding the work having the adhesive tape;

holding means, provided on the holding table, for sucking and holding the work having the adhesive tape; and gas supply means for supplying a gas between the holding member and the work having the adhesive tape.

According to the releasing apparatus of the present invention, it is possible to reliably take out the adhesive tape entering into the sucking hole of the holding member from the sucking hole, and to eliminate the residual pressure between the adhesive tape and the holding member. Further, the releasing process can be carried out with a series of operations, it becomes easy to release and thus, it is possible to suppress the crack and damage of the article and work having the adhesive tape such as a semiconductor wafer.

The releasing apparatus of the present invention further comprises: a control section which switches over the suction and holding of the work having the adhesive tape by the holding means and the supply of gas between the holding member and the work having the adhesive tape by the gas supply means.

With this structure, it becomes easy to adjust the holding force by the suction of the work having the adhesive tape on the holding table.

For example, the holding table may commonly use the discharging flow path for sucking the work having the adhesive tape by the holding means, and the flow path for supplying the gas by the gas supply means. Further, the holding table may separately include the discharging flow path for sucking the work having the adhesive tape by the holding means, and the flow path for supplying the gas by the gas supply means.

In the releasing apparatus of the present invention, preferably, the holding member is made of a porous material.

If the holding member is made of a porous material, it becomes easy to provide the sucking means for sucking the work having the adhesive tape. Further, since the gas can be supplied through the porous material, the gas can easily be supplied between the work having the adhesive tape and the holding member.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An example of embodiments of the present invention will be explained with reference to the drawings.

Figure 1:
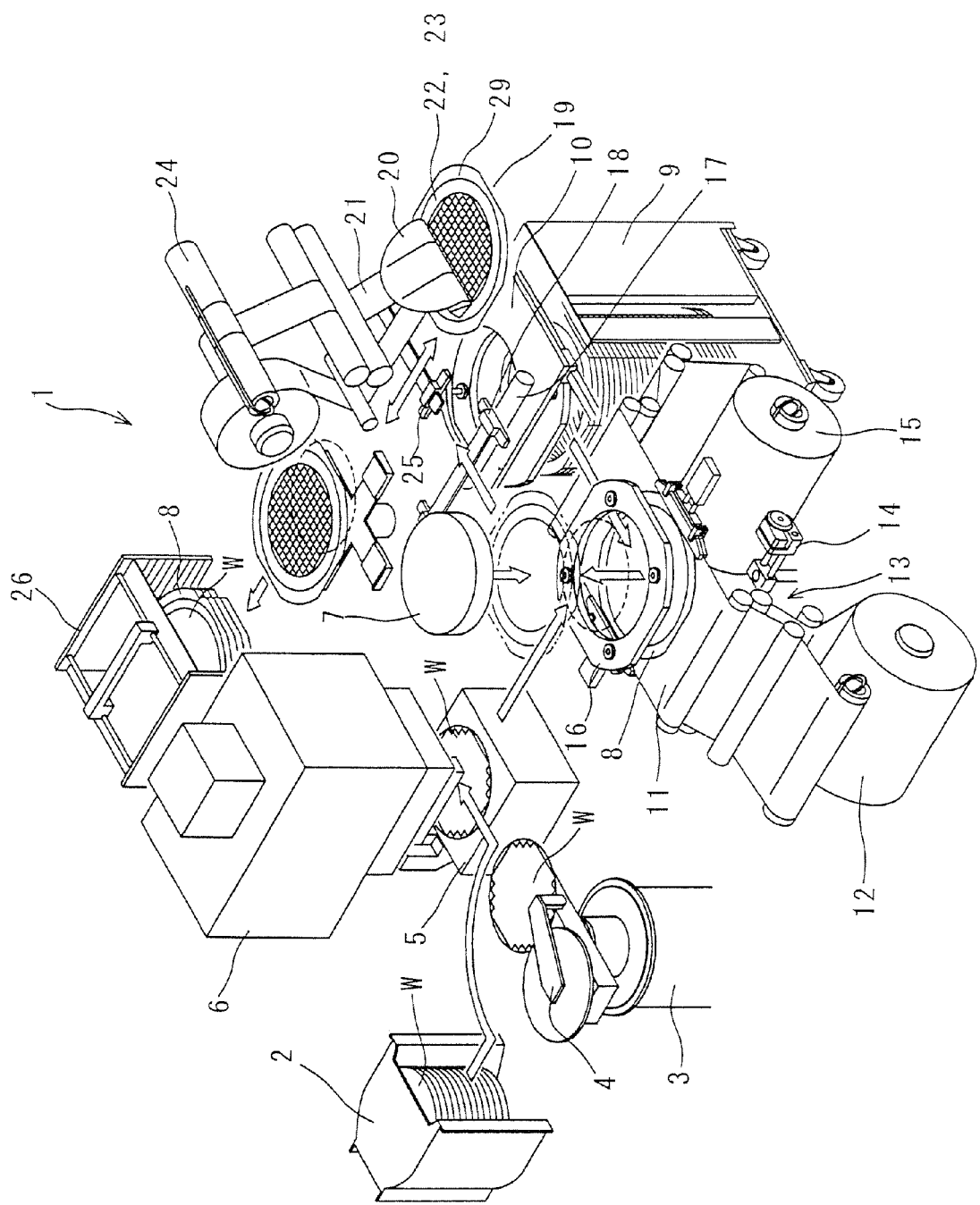
FIG. 1 is a schematic perspective view of an essential portion of one example of a semiconductor wafer mount apparatus having one example of an embodiment of a releasing apparatus of a work having an adhesive tape according to the present invention.

FIG. 1 is a schematic perspective view showing an essential portion of one example of a semiconductor wafer mount apparatus having one example of embodiments of a releasing apparatus of a work having an adhesive tape according to the present invention.

As shown in FIG. 1, a semiconductor wafer mount apparatus 1 of the embodiment includes a wafer supply section 2 to which a cassette. A plurality of layers of semiconductor wafers (wafers, hereinafter) W subjected to the back grind process are accommodated in the cassette. The semiconductor wafer mount apparatus 1 also includes a wafer transport mechanism 3 having a robot arm which bends and turns, a wafer pressing mechanism 4 which corrects a warped wafer into a flat surface, an alignment stage 5 which carries out the positioning, an ultraviolet rays irradiation unit 6 for irradiating the surface protecting tape with ultraviolet rays, a wafer chuck table 7 for sucking and holding the wafer W, a ring frame supply section 9 into which a ring frame 8 is loaded, a ring frame transport mechanism 10 for transporting the ring frame 8, a dicing tape supplying section 12 for supplying a dicing tape 11, a dicing tape joining unit 13 for joining the dicing tape 11, a dicing tape cut section 14 for cutting the dicing tape 11, a dicing tape collecting section 15 for collecting the dicing tape 11 after it is cut, a ring frame vertically moving mechanism 16 which vertically moves the ring frame 8 to which the dicing tape 11 is joined, a wafer mount mechanism 17 for joining the wafer W to the dicing tape 11 which is joined to the ring frame 8, a wafer mount frame transport mechanism 18 for transporting the wafer mount frame, a separating table 19 which sucks and holds the wafer mount frame constituting the releasing apparatus to separate the surface protecting tape 20, a separating tape joining unit 22 for joining the separating tape 21 to the wafer W which is mounted on the separating table 19, a separating tape separating unit 23 for separating the joined separating tape 21, a tape collecting section 24 for winding and collecting the separated and processed separating tape, a wafer mount frame accommodating mechanism 25 for accommodating the wafer mount frame, and a wafer mount frame collecting section 26 to which a cassette is mounted. A plurality of layers of processed wafer mount frames are accommodated in the cassette.

The wafer supply section 2 inserts wafers W in their horizontal attitude with their surfaces on which the protecting tapes are joined, into the cassette and accommodates therein in a state in which an appropriate gaps are maintained between the wafers in the vertical direction, and load the cassette into the cassette stage. The wafer mount frame collecting section 26 also inserts the ring frame 8 to which the wafers W from which protecting tapes are separated are mounted, into the ring frame cassette in a state in which an appropriate gaps are maintained between the wafers in the vertical direction, and accommodates the same and loads the ring frame 8 into the cassette stage.

The robot arm of the wafer transport mechanism 3 can horizontally move forward and backward and turn. The wafer transport mechanism 3 takes out the wafer W from the wafer supply section 2 and supplies the wafer W to the alignment stage 5.

When the wafer W supplied to the alignment stage 5 is warped and can not be vacuum sucked and held, the wafer pressing mechanism 4 presses the wafer W from its upper surface to correct the warped surface into a flat surface so that the alignment stage 5 can suck and hold the wafer W.

The alignment stage 5 carries out the positioning of the wafer W based on an orientation flat of the wafer W or detection of a notch. When the surface protecting tape 20 joined to the wafer surface is ultraviolet rays-hardening type adhesive tape, the ultraviolet rays irradiation unit disposed above the alignment stage 5 irradiates the adhesive tape with ultraviolet rays.

Then, the wafer W is sent to or received from the wafer chuck table 7 by means of the alignment stage 5 while keeping the corrected flat surface of the wafer W.

The ring frame supply section 9 accommodates the ring frames 8 which are positioned in a constant direction and which are laminated on one another. The ring frame transport mechanism 18 transports the ring frame 8 while vacuum sucking and holding the ring frame 8.

The dicing tape supplying section 12 guides the dicing tape 11 taken out from a whole tape roll to the dicing tape joining unit 13 and the dicing tape collecting section 15 through a lower portion of the ring frame 8. The dicing tape 11 is wider than a diameter of the ring frame 8.

The dicing tape joining unit 13 joins the dicing tape 11 to the ring frame 8 and then, cuts the dicing tape on the ring frame by means of the dicing tape cut section 14. The dicing tape collecting section 15 collects the dicing tape 11 after it is cut.

The ring frame vertically moving mechanism 16 vertically moves the ring frame 8 to which the dicing tape 11 is joined. A back surface of the wafer W is joined to the ring frame 8 to which the dicing tape 11 is joined to carry out the wafer mount.

The wafer mount frame transport mechanism 18 vacuum sucks and holds the wafer mount frame 29 and transports the same.

Figure 2:
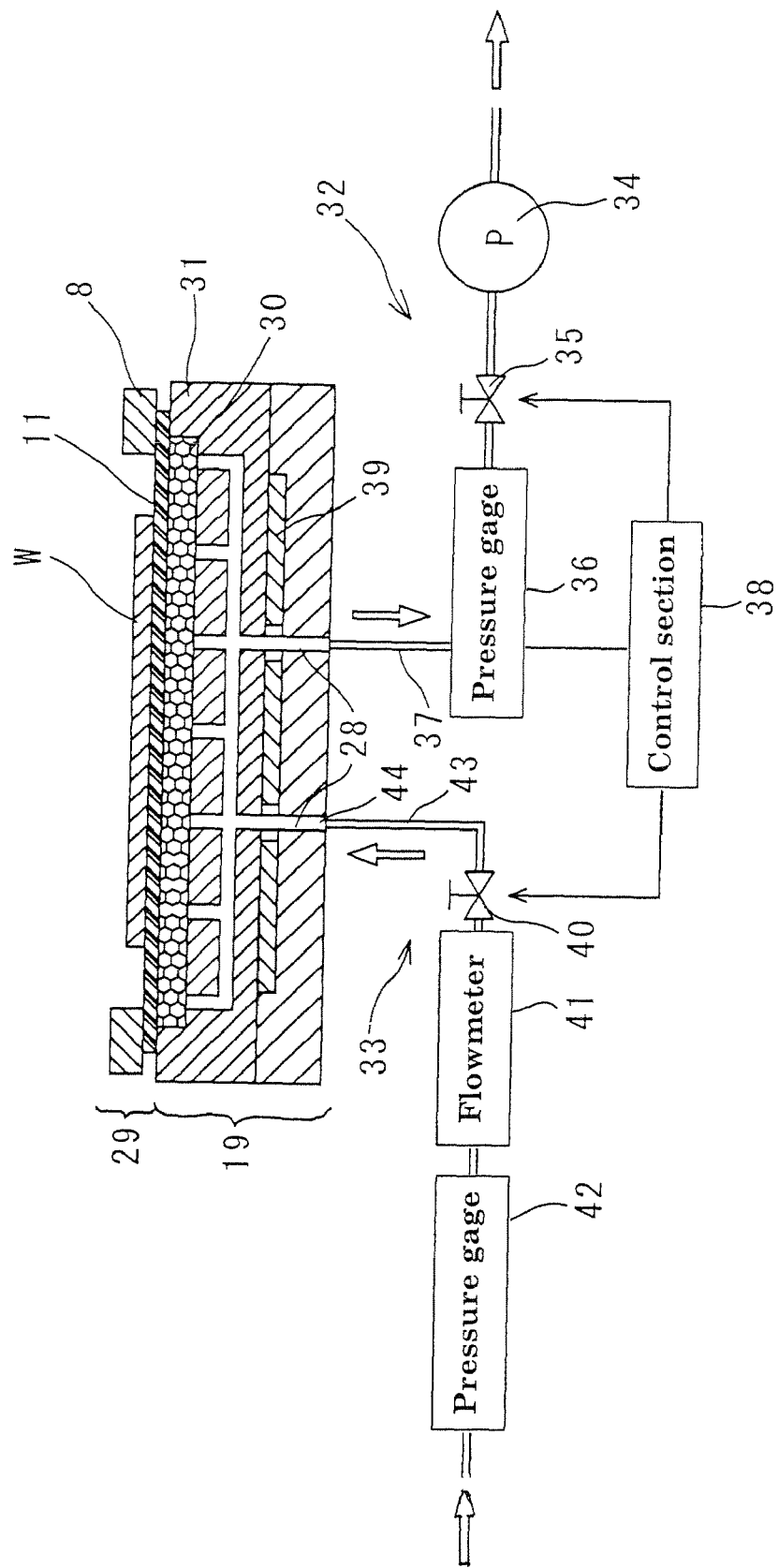
FIG. 2 is a schematic sectional view showing an essential portion of one example of the releasing apparatus of the work having the adhesive tape according to the present invention.

As shown in FIG. 2, the separating table 19 constituting the releasing apparatus includes a holding table 31 having a holding member 30 on which a wafer mount frame 29 is mounted and held. The wafer mount frame 29 comprises the ring frame 8 to which the dicing tape 11 as the work having the adhesive tape is joined. The separating table 19 also comprises holding means 32 which is provided on the holding table 31 and which sucks and holds the wafer mount frame 29, and gas supply means 33 for supplying a gas between the holding member 30 and the wafer mount frame 29.

The holding member 30 is smaller than the work having the adhesive tape (wafer mount frame 29) so that the holding member 30 can suck and hold the work having the adhesive tape. The holding member 30 is made of a porous material such as an inorganic material, e.g., aluminum oxide, and is disposed in the holding table 31. The holding means 32 capable of sucking and holding the wafer mount frame 29 through the holding member 30, and the gas supply means 33 for supplying the gas between the holding member 30 and the wafer mount frame 29 are continuously provided on the holding table 31.

The holding means 32 comprises a passage 28 formed in the holding table 31 for discharging and supplying a gas, a discharging pipe 37 connected to the passage 28, a pressure gage 36 for measuring a pressure in the passage 28 formed in the holding table 31, and pressure adjusting means 35 such as a solenoid valve provided between the pressure gage 36 and vacuum discharging means 34 such as a vacuum pump. The pressure adjusting means 35 is opened and closed by a signal from a control section 38, and adjusts the pressure in the passage 28.

The gas supply means 33 for supplying a gas between the wafer mount frame 29 and the holding member 30 comprises a supply pipe 43 connected to the passage 28 formed in the holding table 31, pressure adjusting means 40 such as a solenoid valve connected to the supply pipe 43, a flowmeter 41, and a pressure gage 42. The pressure adjusting means 40 is connected to the control section 38 and is opened and closed by a signal from a pressure of the pressure gage 36 provided in the discharging pipe 37, thereby adjusting the pressure. Although only one passage 28 is provided in the holding table 31 for supplying and discharging a gas in FIG. 2, a passage 28 for supplying the gas and another passage 28 for discharging the gas may separately be provided.

These passages 28 are branched substantially in the entire region of the work having the adhesive tape (wafer mount frame 29) in the holding table 31, but they may be branched outside the holding table 31. It is preferable that each of the branched passage is provided with a valve which is opened and closed by a signal from the control section 38. With this structure, it is possible to reliably supply and discharge the gas from the central portion of the holding member to outside in sequence.

Other than branching the gas passage 28 inside or outside of the holding table 31 as described above, if two or more gas supply openings 44 which are connection between the supply pipe 43 and the passage 28 are formed, and passages connected to the gas supply openings 44 are formed in the holding table 31, it is possible to adjust the holding force of the holding member 30 more reliably.

The gas to be supplied by the supply means 33 is not limited, and any gas may be used only if it can deteriorate the adhesion between the holding member 30 and the work having the adhesive tape. Examples of the gas are compressed air, nitrogen gas and argon gas.

As shown in FIG. 1, the separating table 19 vacuum sucks and holds the wafer mount frame 29, and the separating tape 21 is joined to the surface protecting tape 20 on the wafer W by the separating tape joining unit 22. The tape separating unit 22 separates the joined separating tape 21 and the surface protecting tape 20 integrally. The tape collecting section 24 collects the separated and processed separating tape 21. When the surface protecting tape 20 is to be separated, the wafer mount frame 29 is heated by a heater 39 (see FIG. 2) provided in the holding table 31 so that the surface protecting tape 20 can easily be separated. At that time, since the dicing tape 11 is also heated, the dicing tape 11 is prone to be softened and deformed, and the dicing tape 11 can easily enter the hole of the holding member 30. In the present embodiment, however, the gas is supplied between the holding member 30 and the dicing tape 11 to expel the dicing tape 11 entering into the hole of the holding member 30 toward the surface of the holding member 30, and the wafer mount frame 29 can easily be released.

The wafer mount frame accommodating mechanism 25 vacuum sucks and holds the wafer mount frame and transports the same, and prepares to accommodate the wafer mount frame into the wafer mount frame collecting section 26.

Next, a basic procedure of the semiconductor wafer mount apparatus having one example of the embodiment of the releasing apparatus of the work having the adhesive tape will be explained.

First, the robot arm of the wafer transport mechanism 3 sucks and holds one wafer W from the cassette of the wafer supply section 2 and takes the wafer W out and transports the same onto the alignment stage 5. The surface of the wafer W is corrected into a flat surface by the wafer pressing mechanism 4 and in this state, the wafer W is sucked and held. The positioning of the wafer W is carried out based on the orientation flat of the wafer W or detection of a notch or the like. Then, when the surface protecting tape 20 joined to the wafer W is an ultraviolet rays hardening type tape, the tape is irradiated with ultraviolet rays on the alignment stage 5.

The alignment stage 5 is moved to a position below the wafer chuck table 7, the positioned wafer W is received and supplied while keeping the flat surface with respect to the wafer chuck table 7.

The ring frame 8 sucks, holds and takes out the laminated ring frame supply sections 9 one by one, and transports the same to an joining position of the dicing tape 11.

Here, the dicing tape 11 is joined and then, the dicing tape 11 is cut on the ring frame 8. After the cutting, the unnecessary dicing tape 11 is wound, and the ring flame 8 to which the dicing tape 11 is joined is formed.

Thereafter, the ring frame 8 is moved upward, the wafer and the dicing tape joined to the ring frame 8 by the mount roller is joined (wafer mount) from a lower end of the ring frame 8.

Next, in order to separate the surface protecting tape 20 on the wafer W, the wafer mount frame 29 is transported to the separating table 19 and is sucked and held. The wafer mount frame 29 is sucked and held by discharging out the gas in the passage 28 formed in the holding table 31 by means of the vacuum pump 34. The separating tape 21 is joined to the surface protecting tape 20 which is joined to the wafer W, and the separating tape 21 is separated, thereby separating the surface protecting tape. After the surface protecting tape 20 on the wafer W is separated, the gas is supplied in succession between the separating table 19 and the wafer mount frame 29 from the central portion of the wafer mount frame 29 toward the outside thereof by the gas supply means 33. With this, the adhesion between the wafer mount frame 29 and the separating table 19 is deteriorated to facilitate the releasing operation of the wafer mount frame 29 from the separating table 19. Then, the wafer mount frames 29 are accommodated into the wafer mount frame collecting section 26 one by one.

The present invention has the above-described structure. If the polishing operation of the back surface is completed, a surface of the dicing adhesive tape which was joined for cutting (dicing) is mounted and held on the holding member which sucks and holds the dicing adhesive tape surface. Then, the surface protecting tape of the semiconductor wafer surface is separated (mount separating operation). Then, the semiconductor wafer to which dicing adhesive tape is joined, i.e., the work having an adhesive tape is released from the holding member made of porous material which sucks and holds. At that time, the work having the adhesive tape is released from the holding member while supplying the gas to reduce the holding force of the holding member between the work having the adhesive tape and the holding member. With this, it is possible to prevent the work such as the semiconductor wafer from being damaged.

When the work having the adhesive tape is to be released, the gas can be supplied in a state in which the work having the adhesive tape is vacuum sucked. By supplying the gas in the state in which the work having the adhesive tape is vacuum sucked, the holding force by the vacuum suction can be adjusted. With this, the holding force by the vacuum suction can be adjusted depending upon the kinds of the adhesive tape and thus, it is possible to prevent the adhesive tape from being deformed when the adhesive tape is vacuum sucked. Further, even if the work is made of thin and friable material, since it is not sucked with a holding force more than necessary when it is sucked and held, it is possible to prevent the wafer from being damaged.

Although the wafer is used as the work having an adhesive tape in the above embodiment, the work having the adhesive tape is not limited to the wafer only if it is held on the holding member formed of porous material and if it has the adhesive tape.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for holding and releasing a work from a holding member which sucks and holds the work having an adhesive tape, the apparatus comprising:
    a holding table having the holding member for mounting and holding the work having the adhesive tape, the holding member having a plurality of suction holes;
    suction means connected to operate the holding member as to suck and hold the adhesive tape while maintaining the adhesive tape in surface-to-surface contact with the holding member, in order to suck and hold the work having the adhesive tape on the holding member; and
    gas supply means for supplying a gas at a predetermined pressure through the holding member to the adhesive tape; and
    a controller for controlling the operation of at least one of the gas supply means and the suction means in a manner such that the gas supply means supplies a gas at a predetermined pressure to the adhesive tape through the holding member for preventing the adhesive tape from being drawn into the plurality of suction holes in the holding member, while the adhesive tape is sucked and held by the holding member,
    wherein a discharging pipe in communication with the suction means and a supply pipe in communication with the gas supply means are each connected in communication with a passage formed in different positions at a bottom of the holding table, and
    each passage is connected and in communication with a horizontal passage intermediately termed parallel to an upper surface of the holding table and the horizontal passage is diverged into a plurality of passages towards the upper surface of the holding table, and
    the gas supplied is discharged from a central portion of the holding member through the horizontal passage to outside in sequence,
    wherein all passages towards the surface of the holding table are in communication with the horizontal passage, and
    wherein the horizontal passage extends radially along a diameter of the holding table.

2. The apparatus according to claim 1, wherein the controller includes a control section which switches over the suction and holding of the work having the adhesive tape by the vacuum means and the supply of gas between the holding member and the work having the adhesive tape by the gas supply means.

3. The apparatus according to claim 1, wherein
    the passages formed in different positions at the bottom of the holding table are connected and in communication with the same horizontal passage.

4. The apparatus according to claim 1, wherein
    the passages formed in different positions at the bottom of the holding table are connected and in communication with different horizontal passages.

5. The apparatus according to claim 1, wherein
    the holding member is made of a porous material.

6. The apparatus according to claim 1, wherein
    a back surface of the work having the adhesive tape is joined to the ring frame and the semiconductor wafer to integrally form the ring frame and the semiconductor wafer.

* * * * *